United States Patent [19]

Endo et al.

[11] Patent Number: 4,987,472
[45] Date of Patent: Jan. 22, 1991

[54] COMPOUND SEMICONDUCTOR EPITAXIAL WAFER

[75] Inventors: Masahisa Endo; Nobuhiko Noto; Toshiharu Takahashi, all of Gunma, Japan

[73] Assignee: Shin-Etsu Handotai Co. Ltd., Tokyo, Japan

[21] Appl. No.: 409,132

[22] Filed: Sep. 19, 1989

Related U.S. Application Data

[63] Continuation-in-part of Ser. No. 328,764, Mar. 27, 1989, abandoned, which is a continuation of Ser. No. 165,597, Mar. 8, 1988, abandoned.

[30] Foreign Application Priority Data

Mar. 16, 1987 [JP] Japan .................. 62-60784

[51] Int. Cl.$^5$ ............. H01L 29/04; H01L 33/00; H01L 29/161; H01L 29/205
[52] U.S. Cl. .................. 357/60; 357/17; 357/16; 357/61; 437/93
[58] Field of Search ............ 357/60, 17, 16, 61; 437/93

[56] References Cited

U.S. PATENT DOCUMENTS

| | | | |
|---|---|---|---|
| 4,216,484 | 8/1980 | Hasegawa et al. | 357/17 |
| 4,865,655 | 9/1989 | Fujita et al. | 357/17 |
| 4,927,778 | 5/1990 | Abbas | 357/45 |
| 4,928,154 | 5/1990 | Umeno et al. | 357/60 |

OTHER PUBLICATIONS

Shaw, D. W., "Influence of Substrate Temperature on GaAs Epitaxial Deposition Rates" J. Electrochemical Society, Apr. 1968, pp. 405–408.

Primary Examiner—Rolf Hille
Assistant Examiner—Robert P. Limanek
Attorney, Agent, or Firm—Wyatt, Gerber, Burke and Badie

[57] ABSTRACT

An epitaxial wafer of gallium phosphide single crystal having an epitaxial layer of gallium phosphide arsenide mixed crystal grown on the surface by the method of vapor-phase epitaxial growth can be freed from surface defects and greatly improved in respect of the electroluminescent intensity of the light-emitting diode prepared therefrom, yield of the light-emitting diodes which can be obtained from said single epitaxial wafer the growth rate of the epitaxial layer when the substrate wafer has a crystallographic surface plane which is inclined from the {001} plane in the <110> direction by 8° to 15° or a crystallographically equivalent plane thereto.

2 Claims, 3 Drawing Sheets

COMPOUND SEMICONDUCTOR EPITAXIAL WAFER

This is a continuation-in-part application from a co-pending U.S. patent application Ser. No. 07/328,764 filed Mar. 27, 1989, now abandoned, which is a continuation application from a now abandoned U.S. patent application Ser. No. 07/165,597 filed Mar. 8, 1988.

BACKGROUND OF THE INVENTION

The present invention relates to a wafer of a compound semiconductor single crystal having an epitaxial layer of gallium phosphide, gallium arsenide or a mixed crystal of gallium phosphide arsenide from which light-emitting diodes capable of emitting very intense electroluminescence can be manufactured in a greatly improved yield of acceptable products by virtue of the substantial absence of surface defects.

It is a well established technology that light-emitting diodes in the green to red wavelength region are manufactured from a wafer of a compound semiconductor single crystal such as gallium phosphide GaP and gallium arsenide GaAs having an epitaxial layer of a mixed crystal of gallium phosphide arsenide of the formula $GaAs_{1-x}P_x$, in which x is zero or a positive number not exceeding 1. The epitaxial layer is formed usually by the method of vapor-phase epitaxial growth due to the easiness in the control of the mixing ratio of the components in the mixed crystal. The single-crystalline substrate wafer used therefor usually has a crystallographic orientation that the surface thereof is inclined by one to several degrees from the {001} plane in the direction of <110>.

One of the problems in the epitaxial growth on the surface of a single crystal wafer in the above mentioned crystallographic orientation is that the surface of the epitaxial layer sometimes has crystallographic defects called "hillocks". The surface defects of this type are mainly responsible for the decreased yield of acceptable products in the manufacture of lamps and display units in which light-emitting diodes prepared from the epitaxial wafer are utilized. In addition, it is a trend in recent years that light-emitting diodes emitting more and more intense electroluminescence are required since a single light-emitting diode has been used practically in the lamp and display uses. In this regard, the epitaxial wafers of a compound semiconductor of the above mentioned prior art are far from satisfaction of the demands.

SUMMARY OF THE INVENTION

The present invention accordingly has an object to provide a wafer of a compound semiconductor having an epitaxial layer of gallium phosphide, gallium arsenide or a gallium phosphide arsenide mixed crystal from which light-emitting diodes of high-intensity electroluminescence can be manufactured in a greatly improved yield of acceptable products by virtue of the substantial absence of surface defects.

Thus, the wafer of gallium phosphide single crystal having an epitaxial layer of gallium phosphide arsenide mixed crystal formed on one surface provided by the invention comprises:

(A) a substrate of a gallium phosphide single crystal in the form of a wafer; and (B) an epitaxial layer of gallium phosphide arsenide mixed crystal having a composition represented by the formula $GaAs_{1-x}P_x$, where x is zero or a positive number not exceeding 1, formed on the surface of the substrate by the method of vapor phase deposition, in which the surface plane of the substrate wafer is selected from the group consisting of:

(a) the crystallographic planes inclined from the (001) plane in the [110] or [$\bar{1}\bar{1}$0] direction;
(b) the crystallographic planes inclined from the (00$\bar{1}$) plane in the [1$\bar{1}$0] or [$\bar{1}$10] direction;
(c) the crystallographic planes inclined from the (100) plane in the [011] or [0$\bar{1}\bar{1}$] direction;
(d) the crystallographic planes inclined from the ($\bar{1}$00) plane in the [01$\bar{1}$] or [0$\bar{1}$1] direction;
(e) the crystallographic planes inclined from the (010) plane in the [101] or [$\bar{1}$0$\bar{1}$] direction; and
(f) the crystallographic planes inclined from the (0$\bar{1}$0) plane in the [10$\bar{1}$] or [$\bar{1}$01] direction, the angles of inclination being each in the range from 8° to 15°.

Preferably, the angle of inclination of the substrate surface in the direction of <110> is in the range from 8° to 12°.

DETAILED DESCRIPTION OF THE PREFERRED EMBODIMENTS

Figure 1:
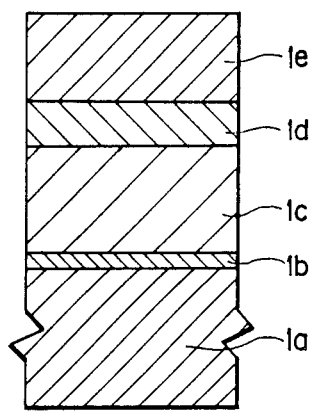
FIG. 1 is a schematic cross sectional view of an epitaxial wafer according to the invention.

As is described above, the most characteristic feature of the inventive wafer of a compound semiconductor having an epitaxial layer of gallium phosphide, gallium arsenide or a gallium phosphide arsenide mixed crystal is that the plane of the substrate surface is inclined from a specific crystallographic plane in a specific crystallographic direction by a specific angle of inclination.

Namely, the plane of the substrate surface, on which the epitaxial layer of gallium phosphide arsenide is grown by the method of vapor phase deposition, is a crystallographic plane se-lected from the group consisting of:

(a) the crystallographic planes inclined from the (001) plane in the [110] or [$\bar{1}\bar{1}$0] direction;
(b) the crystallographic planes inclined from the (00$\bar{1}$) plane in the [1$\bar{1}$0] or [$\bar{1}$10] direction;
(c) the crystallographic planes inclined from the (100) plane in the [011] or [0$\bar{1}\bar{1}$] direction;
(d) the crystallographic planes inclined from the ($\bar{1}$00) plane in the [01$\bar{1}$] or [0$\bar{1}$1] direction;
(e) the crystallographic planes inclined from the (010) plane in the [101] or [$\bar{1}$0$\bar{1}$] direction; and (f) the crystallographic planes inclined from the $(0\bar{1}0)$ plane in the $[10\bar{1}]$ or $[\bar{1}01]$ direction,
the angles of inclination being each in the range from 8° to 15°.

When the epitaxial growth of the layer of a gallium phosphide arsenide is performed on the substrate surface having the above specified crystallographic orientation, crystallographic irregularity and disorder on the surface of the epitaxial layer can be effectively prevented in the process of vapor phase deposition so that the wafers of the invention having an epitaxial layer are very advantageous in respect of the greatly increased intensity of electroluminescence of the light-emitting diodes manufactured from the wafer.

The substrate may be a wafer of a single crystal of a so-called III-V Group compound semiconductor between an element belonging to the IIIb Group in the Periodic Table including aluminum, gallium and indium and an element belonging to the Vb Group in the Periodic Table including phosphorus, arsenic, antimony and bismuth. The compound semiconductor used in the invention is preferably gallium phosphide GaP or gallium arsenide GaAs, of which the invention is better applicable to gallium phosphide. Single crystals of these compound semiconductors have a zinc blende-type crystalline structure. The crystallographic planes defined by (a) to (f) above are all crystallographically equivalent to form a group referred to as "the inventive plane group" hereinbelow.

In the following, description is given for a particular crystallographic plane defined by (a) above, i.e. a crystallographic plane inclined from (001) in the [110] direction as a typical case. The notation of the crystallographic planes and directions in this application is given according to the way described in: H.C. Gatos et al., Journal of Electrochemical Society, volume 107, No. 5, pages 427 to 436 (1960), according to which the (111) plane is formed of the atoms of the IIIb Group element and the $(\bar{1}\bar{1}\bar{1})$ plane is formed of the atoms of the Vb Group element.

The above mentioned specific crystallographic plane obtained by inclining the (001) plane in the [110] direction is a typical example of the equivalent planes belonging to the inventive plane group. For comparative reason, the other crystallographic plane obtained by inclining the (001) plane in the $[\bar{1}10]$ direction is selected as typical, which is crystallographically equivalent planes of a group. This group, which is referred to as "the comparative plane group" hereinbelow, includes:
(a') the crystallographic planes inclined from the (001) plane in the $[1\bar{1}0]$ or $[\bar{1}10]$ direction;
(b') the crystallographic planes inclined from the $(00\bar{1})$ plane in the [110] or $[\bar{1}\bar{1}0]$ direction;
(c') the crystallographic planes inclined from the (100) plane in the $[01\bar{1}]$ or $[0\bar{1}1]$ direction;
(d') the crystallographic planes inclined from the $(\bar{1}00)$ plane in the [011] or $[0\bar{1}\bar{1}]$ direction;
(e') the crystallographic planes inclined from the (010) plane in the $[10\bar{1}]$ or $[\bar{1}01]$ direction; and
(f') the crystallographic planes inclined from the $(0\bar{1}0)$ plane in the [101] or $[\bar{1}0\bar{1}]$ direction.

In the following, description is given by way of examples making reference to the inventive and comparative plane groups.

In the first place, a description is given of the process for the preparation of a wafer having an epitaxial layer of $GaAs_{1-x}P_x$, with a region of a constant mixing ratio at x=0.65, used for the manufacture of orange light-emitting diodes as is illustrated in FIG. 1 schematically by a cross section.

EXAMPLE 1.

Substrate wafers were prepared in the following manner. Thus, wafers each having a thickness of 350 μm were prepared by slicing a single crystal boule of gallium phosphide GaP having the axis in the crystallographic orientation of [001] and containing $2.5 \times 10^{17}$ atoms/cm$^3$ of tellurium atoms added as an n-type dopant. The wafers were each finished into a substrate wafer 1a having a thickness of about 300 μm and mirror-polished on one side by conventional mechanochemical polishing. These mirror-polished substrate wafers had surfaces selected in the crystallographic planes obtained by inclining the (001) plane in two different directions. One was in the [110]±1° direction and the other was in the $[\bar{1}10]\pm1°$ direction with an off angle of 0, 3, 5, 8, 10, 12, 15 or 20° in common.

The gaseous mixtures used in the process of vapor-phase epitaxial growth included hydrogen ($H_2$), hydrogen sulfide diluted with hydrogen in a concentration of 50 ppm by volume ($H_2S/H_2$), phosphine diluted with hydrogen in a concentration of 10% by volume ($PH_3/H_2$), arsine diluted with hydrogen in a concentration of 10% by volume ($AsH_3/H_2$), high-purity hydrogen chloride (HCl) and high-purity ammonia gas ($NH_3$).

One of the above prepared substrate wafers of gallium phosphide 1a after cleaning and a vessel containing high-purity gallium metal were positioned in a vertical-type reactor. The inner space of the reactor was thoroughly flushed first with high-purity nitrogen gas and then with hydrogen gas as the environment gas followed by starting of temperature elevation. When the temperature of the substrate wafer had reached the predetermined temperature of 800° C., growth of the epitaxial layer having a composition of $GaAs_{1-x}P_x$, with a region of a constant mixing ratio at x=0.65 for orange emission, was started in the following manner. Thus, $H_2S/H_2$ gas and HCl gas were introduced into the reactor at rates of 10 ml/minute and 42 ml/minute, respectively, to form GaCl by the reaction of hydrogen chloride with the gallium. Simultaneously, $PH_3/H_2$ gas was introduced into the reactor at a flow rate of 170 ml/minute for 10 minutes to form, through the reaction with the GaCl, an epitaxial layer of gallium phosphide GaP, which is referred to as the first epitaxial layer 1b hereinbelow, on the surface of the substrate wafer.

In the next place, another epitaxial layer of $GaAs_{1-x}P_x$ mixed crystal having varied mixing ratio, i.e. variable value of x, of the mixed crystal, which is referred to as the second epitaxial layer 1c hereinbelow, was grown on the first epitaxial layer 1b in the following manner. Thus, the $H_2S/H_2$, HCl and $PH_3/H_2$ gases were passed through the reactor at constant flow rates of 100 ml/minute, 42 ml/minute and 170 ml/minute, respectively, without the $AsH_3/H_2$ gas and then the $AsH_3/H_2$ gas was introduced at a gradually increasing flow rate up to 98 ml/minute in 140 minutes so that the value of x in the formula of the mixed crystal was decreased down to 0.65 starting from one.

Thereafter, the flow rates of the $H_2S/H_2$, HCl, $PH_3/H_2$ and $AsH_3/H_2$ gases were kept constant at 10 ml/minute, 42 ml/minute, 170 ml/minute and 98 ml/minute, respectively, for 50 minutes so that a further epitaxial layer having a constant value of x equal to 0.65, which is referred to as the third epitaxial layer 1d hereinbelow, was grown on the second epitaxial layer 1c.

Finally, NH$_3$ gas was introduced at a constant flow rate of 350 ml/minute in addition to the above mentioned four gases introduced each in the same flow rate as in the growth of the third epitaxial layer 1d for 100 minutes so that a nitrogen-containing fourth epitaxial layer 1e was grown on the third epitaxial layer 1d to complete the epitaxial layer of the gallium phosphide arsenide mixed crystal GaAs$_{0.35}$P$_{0.65}$ of an epitaxial wafer suitable for orange light-emitting diodes.

In the following, detailed description is given of the relationship between the crystallographic orientation of the surfaces of the single crystalline substrate wafers and the quality of the epitaxial layers in the epitaxial wafers obtained in the above described manner.

Figure 2:
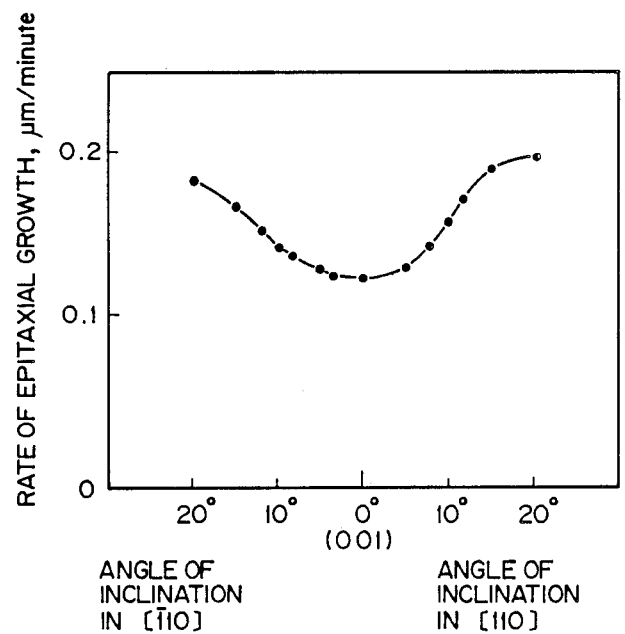
FIG. 2 is a graphic showing of the growth velocity of the epitaxial layer of gallium phosphide arsenide mixed crystal as a function of the angle of crystallographic inclination of the substrate surface.

FIG. 2 graphically shows the relationship between the growth rate of the epitaxial layer of GaAs$_{0.35}$P$_{0.65}$ on the surface of the gallium phosphide single crystal wafer as the substrate by vapor-phase deposition and the crystallographic orientation of the surface plane of the substrate wafer in which the abscissa is given with up to 20° of the angle of inclination of the surface plane from (001) plane in the [110] direction as an example belonging to the inventive plane group and in the [$\bar{1}$10] direction as an example belonging to the comparative plane group. The figure leads to a conclusion that the growth rate of the epitaxial layer is increased when the crystallographic plane of the substrate surface is inclined from the (001) plane in the [110] or [$\bar{1}$10] direction with increase in the angle of inclination so that the time taken for growing an epitaxial layer having a desired thickness can be decreased to improve the productivity.

Figure 3A:
FIGS. 3a and 3b are each an optical microphotograph of the surface of the epitaxial layer formed on a substrate surface having an angle of inclination of 5° or 12°, respectively, from the (001) plane in the [110] direction.
Figure 3B:
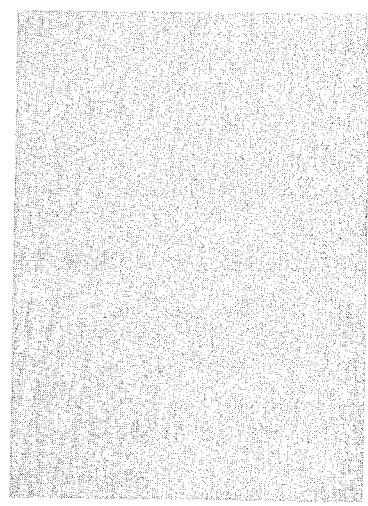

When the surface plane of the substrate wafer has the above mentioned angle of inclination smaller than 5° from the (001) plane in the [110] direction in the vapor-phase growth of an epitaxial layer of gallium phosphide arsenide mixed crystal GaAs$_{1-x}$P$_x$, x being zero or a positive number not exceeding 1, the surface of the epitaxial layer as grown sometimes has a crystallographic defect called a "hillock" as is illustrated in the microphotograph of FIG. 3a. When the angle of inclination is in the range from 8° to 15° or, in particular, from 8° to 12°, on the contrary, no such a crystallographic defect is found on the surface of the epitaxial layer as is illustrated in FIG. 3b.

Figure 4A:
FIGS. 4a and 4b are each an optical microphotograph of the surface of the epitaxial layer formed on a substrate surface having an angle of inclination of 5° or 12°, respectively, from the (001) plane in the [$\bar{1}$10] direction.
Figure 4B:

When the direction of inclination of the crystallographic surface plane of the substrate wafer is not the [110]±1° but the [$\bar{1}$10]±1°, on the other hand, no satisfactory surface condition of the epitaxial layer can be obtained irrespective of the angle of inclination in the epitaxial growth of the gallium phosphide arsenide mixed crystal layer by the vapor-phase deposition. When the angle of inclination is smaller than 5°, the nature of the surface defects is the hillock illustrated in the microphotograph of FIG. 4a. The type of the surface defects is different with the angle of inclination of 12° to 20° as is illustrated in FIG. 4b. These surface defects cause all troubles in the manufacturing process of light-emitting diodes and decrease in the number of acceptable products of light-emiting diodes manufactured from a single epitaxial wafer.

It should be noted that, in the above description, the direction to which the surface plane of the substrate wafer is inclined, for example, from the (001) plane in the [110] direction, need not be exactly one of the specific crystallographic directions but a deviation of several plus or minus degrees from the specified direction has no particularly adverse effect on the advantages obtained by the invention.

EXAMPLE 2.

Epitaxial wafers having an epitaxial layer of gallium phosphide arsenide mixed crystal GaAs$_{1-x}$P$_x$, in which x was 0.65 or 0.85, were prepared by vapor-phase deposition in a similar manner to Example 1 on the same substrate wafers as used in Example 1 with modification in the relative flow rates of the PH$_3$/H$_2$ and AsH$_3$/H$_2$ gases, in which the flow rates of PH$_3$ and AsH$_3$ were chosen as 230 ml/minute and 30 ml/minute, respectively.

Figure 5:
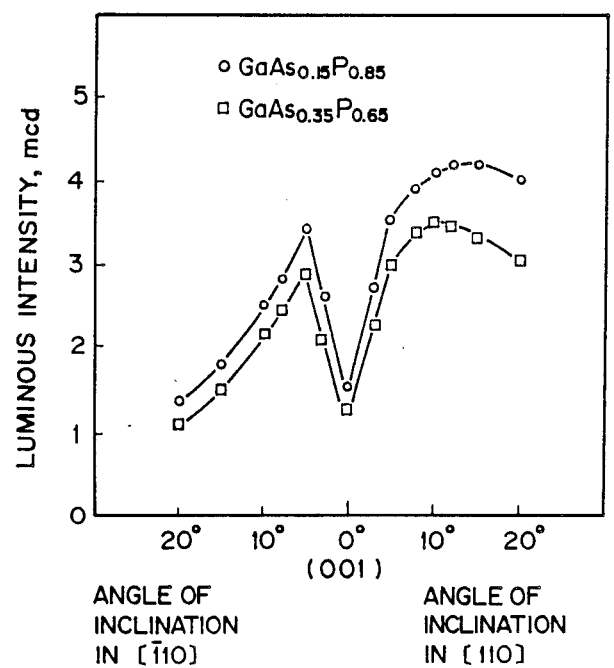
FIG. 5 is a graphic showing of the electroluminscent emission of light-emitting diodes as a function of the angle of inclination of the substrate surface of the epitaxial wafers from which the diodes are manufactured.

Zinc was diffused to the surface of the epitaxial wafers to form a P-N junction and light-emitting diodes were prepared therefrom without resin coating. The luminous intensity of these light-emitting diodes is shown by the curves in FIG. 5 as a function of the angle of inclination by which the surface plane of the substrate surfaces was inclined from the (001) plane in the [110] direction as an example of the inventive plane group or in the [$\bar{1}$10] direction as an example of the comparative plane group. As is clear from the figure, the improvement in the electroluminescent emission was greater when the inclination of the surface plane was in the [110] direction than in the [$\bar{1}$10] direction.

In the yellow light-emitting diodes having an epitaxial layer of the composition GaAs$_{0.15}$P$_{0.85}$, the greatest improvement in the emission intensity was achieved when the angle of inclination from the (001) plane in the [110] direction was in the range from 12° to 15°. In the orange light-emitting diodes having an epitaxial layer of the composition GaAs$_{0.35}$P$_{0.65}$, the optimum angle of inclination was about 10°. The improvement in the electroluminescent emission of the inventive epitaxial wafer is realized presumably by the higher crystallographic quality through the higher growth rate of the epitaxial layer producing substantially no surface defects.

The results of the above described examples lead to a conclusion that the emission intensity of the light-emitting diodes can be greatly increased when the substrate wafer of the compound semiconductor has a surface having a crystallographic orientation of the plane belonging to the inventive plane group such as the (001) plane inclined in the [110] direction by an angle of inclination of 8° to 15° by virtue of the defect-free surface of the epitaxial layer grown on the substrate surface by the vapor-phase deposition.

Although the above given description is given solely for the surface plane of the substrate wafer obtained by inclining the (001) plane in the [110] direction as an example, it should be noted that the scope of the present invention includes the use of substrate wafers of which the surface plane is one of the planes belonging to the inventive plane group defined by (a) to (f) and exactly the same results can be obtained thereby as a matter of course since all of these planes are crystallographically equivalent.

Furthermore, the compound semiconductor for the substrate wafer is not limited to gallium phosphide but gallium arsenide can be used equally although the description above is given solely for gallium phosphide as the substrate material. The selection between gallium phosphide and gallium arsenide may depend on the composition of the gallium phosphide arsenide mixed crystal for the epitaxial layer. Namely, gallium phosphide is preferred when the composition of the gallium phosphide arsenide mixed crystal for the epitaxial layer is rich in the content of phosphorus as compared to arsenic and vice versa.

To summarize the advantages obtained by the present invention, firstly, the productivity can be greatly improved in the growing process of the epitaxial layer having a specified thickness due to the increased rate of the growth. Secondly, the yield of acceptable products of light-emitting diodes is greatly increased from the epitaxial wafers of the present invention because of the substantial absence of any surface defects on the epitaxial layer grown on the substrate surface having the specific crystallographic orientation. Thirdly, the light-emitting diodes manufactured from the inventive epitaxial wafers may have an increased intensity of light emission by about 20% over that manufactured from conventional epitaxial wafers. Accordingly, the epitaxial wafer of the invention is industrially very advantageous as a material of high-intensity light-emitting diodes.

What is claimed is:

1. A wafer of gallium phosphide single crystal having an epitaxial layer of gallium phosphide arsenide mixed crystal formed on one surface, which comprises:

(A) a substrate of a gallium phosphide single crystal in the form of a wafer; and
   (B) an epitaxial layer of gallium phosphide arsenide mixed crystal having a composition represented by the formula $GaAs_{1-x}P_x$, where x is zero or a positive number not exceeding 1, formed on the surface of the substrate by the method of vapor-phase deposition, in which the surface plane of the substrate wafer is selected from the group consisting of:
   (a) the crystallographic planes inclined from the (001) plane in the [110] or [$\bar{1}$10] direction;
   (b) the crystallographic planes inclined from the (00$\bar{1}$) plane in the [1$\bar{1}$0] or [$\bar{1}$10] direction;
   (c) the crystallographic planes inclined from the (100) plane in the [011] or [0$\bar{1}$1] direction;
   (d) the crystallographic planes inclined from the ($\bar{1}$00) plane in the [01$\bar{1}$] or [0$\bar{1}$1] direction;
   (e) the crystallographic planes inclined from the (010) plane in the [101] or [$\bar{1}$0$\bar{1}$] direction; and
   (f) the crystallographic planes inclined from the (0$\bar{1}$0) plane in the [10$\bar{1}$] or [$\bar{1}$01] direction,
   the angles of inclination being each in the range from 8° to 15°.

2. The wafer as claimed in claim 1 wherein the angle of inclination of the substrate surface in the direction of <110> is in the range from 8° to 12°.

* * * * *